United States Patent [19]

Nishizawa et al.

[11] Patent Number: 4,596,605
[45] Date of Patent: Jun. 24, 1986

[54] FABRICATION PROCESS OF STATIC INDUCTION TRANSISTOR AND SOLID-STATE IMAGE SENSOR DEVICE

[76] Inventors: Junichi Nishizawa, 6-16 Komegabukuro 1-chome; Sohbe Suzuki, 3 Otamayashita 1-chome, both of Sendai-shi, Miyagi; Mitsuru Ikeda; Hideki Mutoh, both c/o Fuji Photo Film Co., Ltd., 798 Miyanodai, Kaisei-machi, Ashigarakami-gun, Kanagawa, all of Japan

[21] Appl. No.: 561,443

[22] Filed: Dec. 14, 1983

[30] Foreign Application Priority Data

Dec. 14, 1982 [JP] Japan ................................. 57-218923
Dec. 14, 1982 [JP] Japan ................................. 57-218930

[51] Int. Cl.$^4$ ..................... H01L 21/265; H01L 29/78
[52] U.S. Cl. ......................................... 148/1.5; 29/571; 29/572; 29/576 B; 148/187; 357/22; 357/91
[58] Field of Search ................... 148/1.5, 187; 29/572, 29/571, 576 B; 357/22, 91

[56] References Cited

U.S. PATENT DOCUMENTS

| | | | |
|---|---|---|---|
| 4,004,950 | 1/1977 | Baruch et al. | 148/1.5 |
| 4,133,701 | 1/1979 | Greenstein et al. | 148/1.5 |
| 4,216,029 | 8/1980 | Nishizawa et al. | 148/1.5 |
| 4,358,323 | 9/1982 | Wallace | 148/1.5 |
| 4,364,072 | 12/1982 | Nishizawa | 357/22 |
| 4,406,052 | 9/1983 | Cogan | 29/576 B |
| 4,435,897 | 3/1984 | Kuroda et al. | 29/572 |

OTHER PUBLICATIONS

Akutagawa et al., Jour. Appl. Phys., 50 (1979), 777.

*Primary Examiner*—Upendra Roy
*Attorney, Agent, or Firm*—Cushman, Darby & Cushman

[57] ABSTRACT

In a process for fabricating a static induction transistor having a gate region which is formed in a semiconductor layer including a channel region, ions of an impurity element are implanted into the semiconductor layer from the surface thereof to form the gate region. Ions of an element lighter than the impurity element are implanted into the gate region from the surface of the semiconductor layer in such a way that the concentration of the light element exhibits a plurality of profiles in the depth direction of the semiconductor layer. The semiconductor layer is annealed at a relatively low temperature after the two implanting steps to form the gate region in the semiconductor layer. A solid-state image sensor device is fabricated by using the static induction transistor as a picture cell.

19 Claims, 50 Drawing Figures

FIG_1
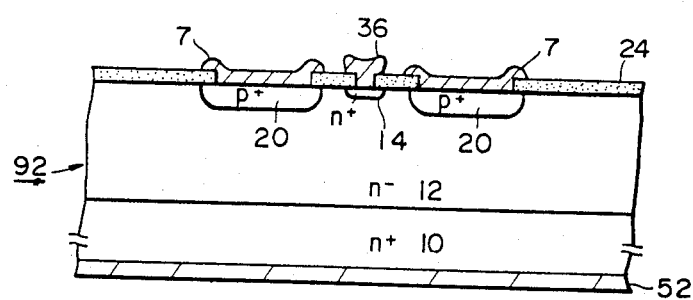
FIG_2
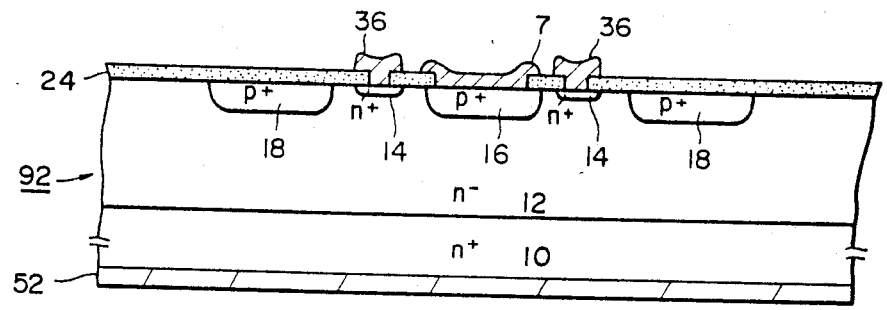

FIG_8A
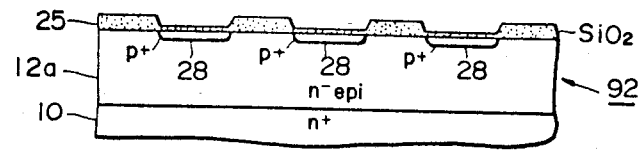
FIG_8B
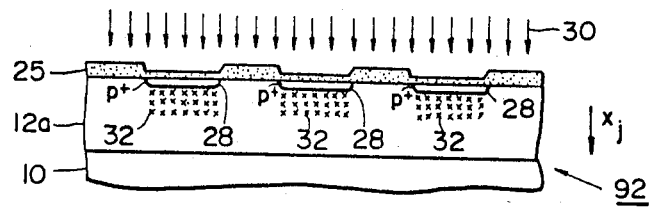
FIG_8C
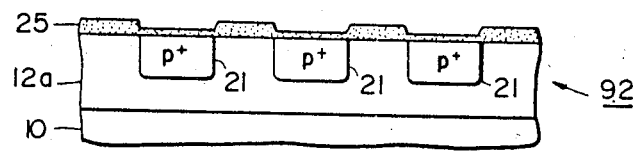
FIG_8D
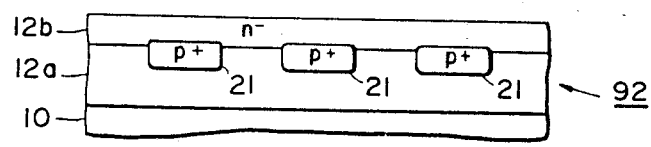
FIG_8E
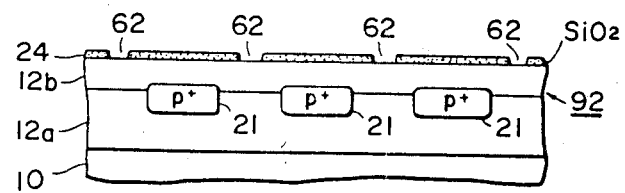

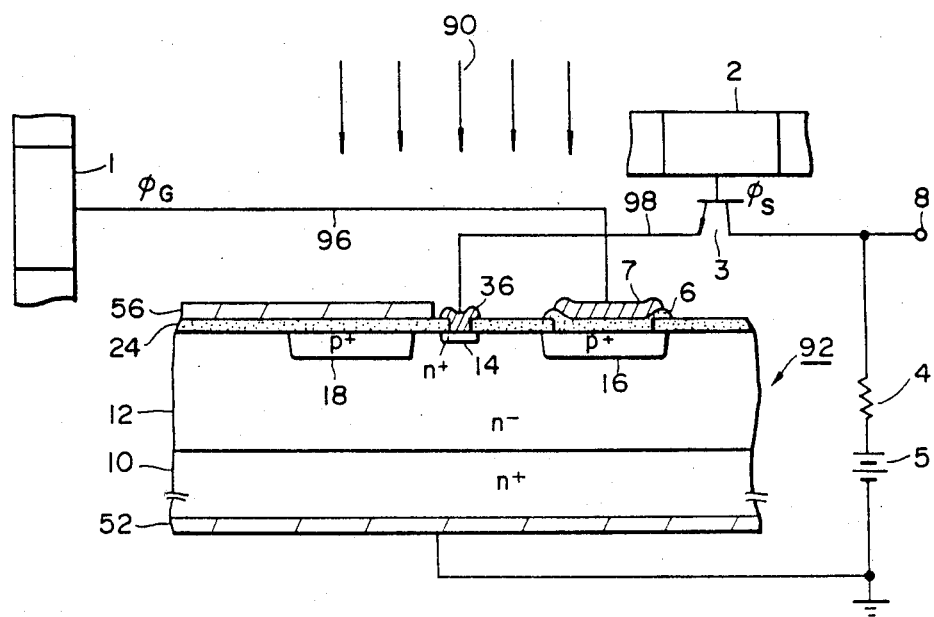
FIG_11

FIG_12
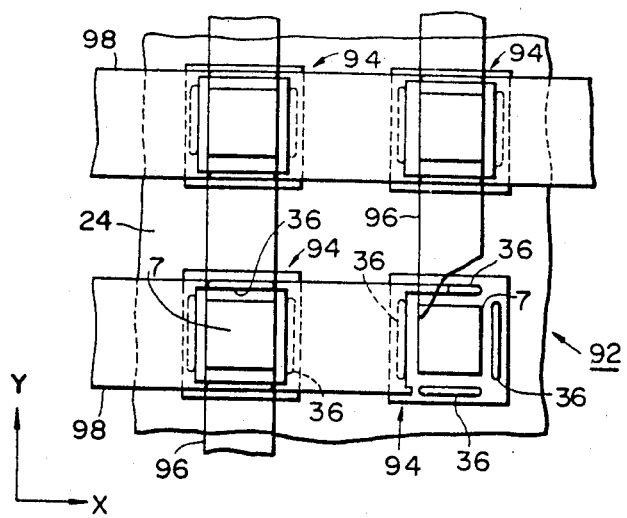
FIG_16
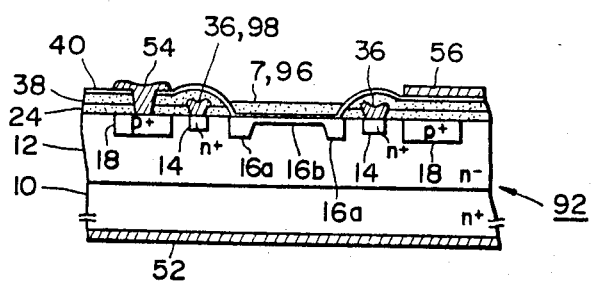

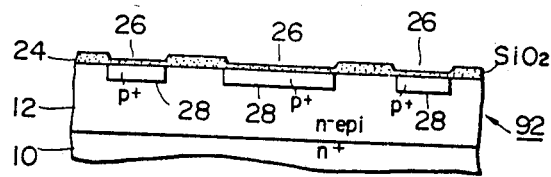
FIG_14A
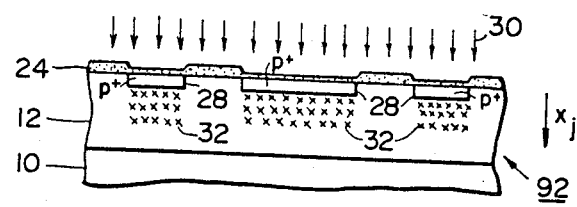
FIG_14B
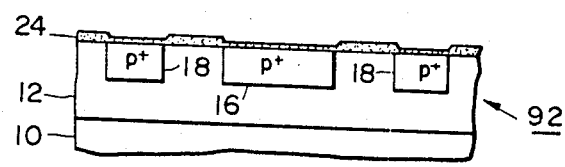
FIG_14C
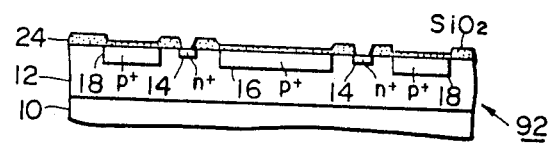
FIG_14D
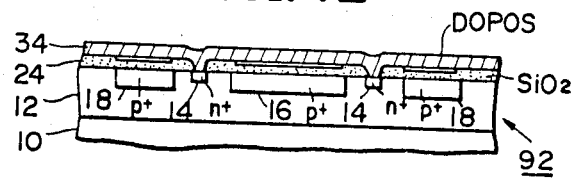
FIG_14E

FABRICATION PROCESS OF STATIC INDUCTION TRANSISTOR AND SOLID-STATE IMAGE SENSOR DEVICE

BACKGROUND OF THE INVENTION

1. Field of the Invention

The present invention relates to a process for fabricating a static induction transistor and to a process for fabricating a solid-state image sensor device using the static induction transistor, and more particularly to a process for fabricating a longitudinal static induction transistor having a source and a drain which are formed on the opposite major surface sides of a substrate, and to a process for fabricating a solid-state image sensor device using the longitudinal static induction transistor.

2. Description of the Prior Art

A static induction transistor is classified as a junction type field effect transistor in a broad sense, but is different from a usual field effect transistor in that an impurity density of a material forming a channel region is low. As a result, in a normal state where no bias voltage is applied to the gate of the static induction transistor, a depletion layer is created so that the channel is pinched off and remains in a normally off state. The static induction transistor has a further feature that a source-drain current ($I_{DS}$) exhibits a non-saturated characteristic with respect to a source-drain voltage ($V_{DS}$).

Due to a diffusion potential difference between the gate region and the channel region, a depletion layer is created in the channel region, so that the channel is pinched off. The pinch-off point is a so-called "true gate". The potential distribution around the "true gate" has a so-called "potential well" having the "true gate" as its bottom. The profile and level of the potential distribution are greatly dependent upon the diffusion potential difference. As a consequence, in order that the channel may be well controlled by the gate (that is, in order that the channel may be well pinched off) the depletion layer must be extended deeply in the direction of thickness in the channel region. That is, it is preferable that the gate region is deeply formed in the channel region compared with the source region.

When the static induction transistors are integrated, it is preferable that variation among the static induction transistor elements is minimized. For instance, the geometric dimensions of the elements in each array on a single chip must be minimized so that the channels may be formed with a uniform width.

In the case of a solid-state image sensor device comprising a plurality of static induction transistors arranged one- or two-dimensionally, it is preferable that the variation among the picture cells be minimized so that a high quality picture can be obtained.

The gate and source regions of the static induction transistor constitute a light sensitive region in which carriers are generated in response to an incident light. Therefore, it is preferable that the variation in the geometric dimensions of the picture cells in each array is minimized so that the channels are formed with a uniform width.

The gate region may be formed by heavily doping acceptors such as boron (B) into an n⁻ ($\nu$) region. According to known ion implantation techniques, even when boron is implanted with the acceleration energy of the order of 400 kV, it penetrates only one micrometer. Even if a thermal diffusion process is employed after the ion implantation process, the thermal diffusion is isotropical so that the introduced boron ions are diffused not only in the longitudinal direction (that is, in the direction of thickness) but also in the lateral direction, that is, in the picture cell array direction. As a result, the dimensions of the gate region must be designed taking into consideration the fact that the gate region is broadened by the thermal diffusion. Since the controllability of the thermal diffusion process is low, it is extremely difficult to fabricate a static induction transistor or a solid-state image sensor device having static induction transistors with a high degree of dimensional accuracy.

SUMMARY OF THE INVENTION

In view of the above, one of the objects of the present invention is to provide a process for fabricating a longitudinal type static induction transistor in which the above disadvantages are removed and the depth of a specific impurity region can be extended deeply in the depth direction so that a high lateral dimensional accuracy is realized.

Another object of the present invention is to provide a process for fabricating a solid-state image sensor device having static induction transistors which can substantially overcome the above described problems and in which the depth of a specific impurity region can be extended deeply in the depth direction so that a high lateral dimensional accuracy is realized.

In order to achieve these objects, in a process for fabricating a static induction transistor having a gate region which is formed in a semiconductor layer including a channel region, a fabrication process in accordance with the present invention comprises: a first step of implanting ions of an impurity element into the semiconductor layer from the surface thereof to form the gate region; a second step of an implanting ions of element lighter than the impurity element into the gate region from the surface of the semiconductor layer in such a way that the concentration of the light element exhibits a plurality of profiles, for instance three profiles, in the depth direction of the semiconductor layer; and a third step of annealing the semiconductor layer at a relatively low temperature like a temperature in a range of 500° C.–1200° C. after the first and second steps to form the gate region in the semiconductor layer.

The first step may precede the second step or the second step may precede the first step.

It is preferable that the first step includes a sub-step of heating the semiconductor layer at a relatively low temperature after the implantation of the ions of the impurity element.

It is also preferable that the semiconductor layer comprises an epitaxially grown layer which is formed on a semiconductor substrate and which has a relatively low impurity concentration, and that the impurity element includes at least one element selected from the group consisting of B, Al and Ga. Preferably, the element lighter than the impurity element may include at least one of H and He.

It is preferable that the relatively low temperature in the annealing step is in the range from 700° C. to 900° C.

The static induction transistor may be a surface gate type or buried gate type static induction transistor.

In a process for fabricating a solid-state image sensor device having picture cells, each of which has a static induction transitor having a gate region formed in a semiconductor layer including a channel region for receiving an incident light signal, the fabrication process comprises: a first step of implanting ions of an impurity element into the semiconductor layer from the surface thereof to form the gate region; a second step of implanting ions of an element lighter than the impurity element into the gate region from the surface of the semiconductor layer in such a way that the concentration of the light element exhibits a plurality of profiles, for instance three profiles, in the depth direction of the semiconductor layer; and a third step of annealing the semiconductor layer at a relatively low temperature like a temperature in a range of 500° C.–1200° C. after the first and second steps to form the gate region in the semiconductor layer.

The first step may precede the second step or the second step may precede the first step.

It is preferable that the first step includes a sub-step of heating the semiconductor layer at a relatively low temperature after the implantation of the ions of the impurity element.

It is also preferable that the semiconductor layer comprises an epitaxially grown layer which is formed on a semiconductor substrate and which has a relatively low impurity concentration, and that the impurity element includes at least one element selected from the group consisting of B, Al and Ga. Preferably, the element lighter than the impurity element may include at least one of H and He.

It is preferable that the relatively low temperature in the annealing step is in the range from 700° C. to 900° C.

The above and other objects, effects, features and advantages of the present invention will become more apparent from the following description of preferred embodiments thereof taken in conjunction with the accompanying drawings.

BRIEF DESCRIPTION OF THE DRAWINGS

FIG. 1 is a schematic cross sectional view showing an example of a non-split gate type static induction transistor;

FIGS. 2 and 3 are schematic sectional views showing examples of a split gate type static induction transistor, respectively;

FIGS. 8A through 8H are explanatory cross sectional views showing an example of the sequential process steps for fabrication of a buried gate type static induction transistor in accordance with the present invention;

FIGS. 10 and 11 are schematic cross sectional views, each showing a part of an example of a solid-state image sensor device having a plurality of split gate type static induction transistors;

FIG. 12 is a schematic top plan view showing an arrangement of picture cells of the solid-state image sensor device shown in FIG. 10;

FIG. 16 is a cross sectional view showing another example of a solid-state image sensor device having a plurality of static induction transistors fabricated in accordance with the present invention.

DETAILED DESCRIPTION OF THE PREFERRED EMBODIMENTS

Figure 3:
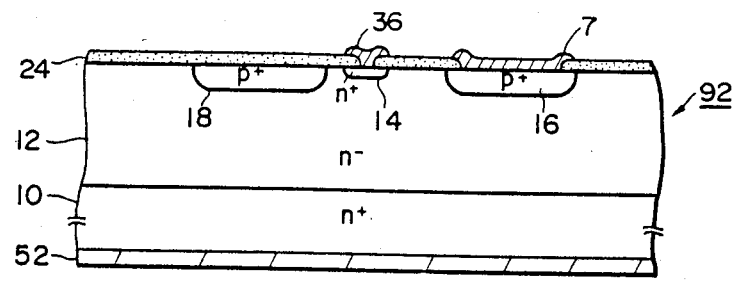

The same reference numerals are used to designate similar or corresponding portions throughout the figures.

FIG. 1 shows one element of a longitudinal type static induction transistor. This transistor is a so-called non-split gate type static induction transistor, since the gate region is not divided into a control gate (CG) and a shielding gate (SG).

Fundamentally, such static induction transistor is fabricated as follows. Firstly, an $n^-$ ($\nu$) or intrinsic (i) layer 12 is epitaxially grown on one major surface of an $n^+$ silicon substrate 10 and then an $n^+$ region 14 and a $p^+$ region 20 are formed in the vicinity of the surface of the epitaxial layer 12. The region 14 is a drain region, while the region 20 is a gate region. A source electrode 52 is formed on the other major surface of the substrate 10.

An SiO$_2$ film 24 is formed on the surface of the epitaxial layer 12 and a drain electrode 36 is so formed on the SiO$_2$ film 24 that the drain electrode 36 is in electrical contact with the drain region 14 through an opening or window formed in the SiO$_2$ film 24, while in like manner, a gate electrode 7 is so formed on the SiO$_2$ film 24 that the gate electrode 7 is in electrical contact with the gate region 20 through an opening or window formed in the SiO$_2$ film 24.

In this structure, the channel formed in the channel region 12 between the source 10 and the drain 10 is pinched off by the depletion layer formed by a diffusion potential at the gate 20. Thus, the static induction transistor functions as a normally off switching element in which a source-drain current IDS exhibits an unsaturated characteristic with respect to a source-drain voltage $V_{DS}$. While the $n^+$ region 14 and the $n^+$ substrate 10 have been described as the drain and source, respectively, it is to be understood that the $n^+$ region 14 may be used as a source and the $n^+$ substrate 10 as a drain.

FIG. 2 shows a so-called split gate type static induction transistor in which a control gate and a shielding gate are separated from each other. Instead of the gate region 20 as shown in FIG. 1, two gate regions 16 and 18 are provided. The gate region 16 is the control gate which controls carrier storage and readout, while the region 18 is the shielding gate which isolates this individual static induction transistor from other or adjacent static induction transistors and provides a reference potential. It is to be understood that in the split gate type static induction transistor, the source and the drain may also be replaced by each other.

FIG. 3 shows a modification of the split gate type static induction transistor of the type shown in FIG. 2. The drain (source) region 14 is formed in the vicinity of the shielding gate 18, so that the expansion of the depletion layer of the control gate region 16 is increased to store many carriers. The depth of the shielding gate region 18 is deeper than that of the control gate region 16, so that the element isolation effect is improved.

Figure 4:
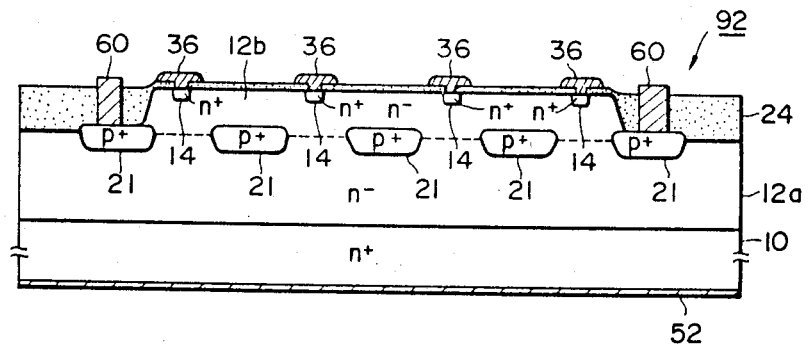
FIG. 4 is a schematic cross sectional view showing an example of a buried gate type static induction transistor.

FIGS. 1 through 3 show the so-called surface gate static induction transistors, in which the gate is formed in the vicinity of the surface. FIG. 4 shows a so-called buried gate type static induction transistor, in which a gate is buried relatively deeply in the $n^-$ epitaxial layer.

In FIG. 4, a structure generally indicated by reference numeral 92 has two $n^-$ epitaxial layers 12a and 12b which have the acceptors of the same element with the same impurity concentration. $p^+$ regions 21 are buried in the $n^-$ layers 12a and 12b at the boundary thereof in the form of a net and extend into both the $n^-$ layers 12a and 12b to form buried gates. The buried gates 21 can be electrically connected through gate electrodes 60 to an external circuit (not shown).

$n^+$ regions 14, as drains, are formed in the vicinity of the surface of the $n^-$ epitaxial layer 12b. Drains 14 are is connected to drain electrodes 36 through openings or windows formed in the $SiO_2$ film 24. In this buried gate type static induction transistor, the drains 14 and the source 10 may also be replaced by each other.

Next referring to FIGS. 5A through 5M, an example of a process for fabricating a surface-gate type static induction transistor in accordance with the present invention will be described. FIGS. 5A through 5M are sectional views showing one static induction transistor and the dimensions are exaggerated for clarity.

First, the $n^+$ silicon substrate 10 is heavily doped with Sb in the order of $10^{18}$ cm$^{-3}$. The $n^-$ layer 12 is epitaxially grown on one major surface of the substrate 10 and the $SiO_2$ film 24 is formed on the epitaxially grown layer 12. The layer 12 is doped with As in the order of $10^{12}$-$10^{15}$ cm$^{-3}$ and has a thickness of 5-10 μm.

Portions 26 of the $SiO_2$ film 24 which correspond to the gate regions 16 and 18 or 21 are partially removed by a wet etching process. The distance between the gate regions 16 and 18 or between the gate regions 21 is 3-10 μm.

Figure 5A:
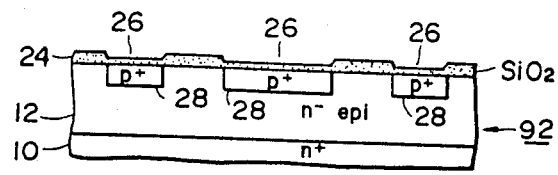
FIGS. 5A through 5M are explanatory cross sectional views showing an example of the sequential process steps for fabrication of a surface gate type static induction transistor in accordance with the present invention.

Next, the impurity as the acceptor, for example, the III group element such as B, Al or Ga, is doped into the portions of the $n^-$ layer 12, which correspond to the gate regions 16 and 18 or 21 through the thin portions 26 of the $SiO_2$ film 24 (FIG. 5A), so that the $p^+$ regions 28 are formed as shown in FIG. 5A. It is advantageous to employ the ion implantation or thermal diffusion process in order to dope the impurities into the layer 12. For instance, in the case of the ion implantation of $B^+$ or $B^{++}$ ions, an acceleration energy is of the order of 10–400 kV and the dosage of dopant is of the order of $10^{12}$-$10^{15}$ cm$^{-2}$. In order to locate the implanted impurity atoms stably at the crystal lattice positions after the ion implantation, an activation annealing may be effected at a low temperature for instance, about 700° C.

Figure 5B:
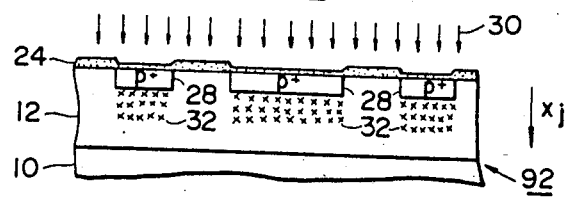

Thereafter, the ions of an element lighter than the doped impurity such as B are implanted into the portions corresponding to the gate regions 16 and 18 or 21 (FIG. 5B). The lighter element may be for instance H or He. In the case of the ion implantation of $H^+$, the acceleration energy is 10–200 kV and the dosage of the dopant is in the order of $10^{14}$-$10^{17}$ cm$^{-2}$. It is preferable that the ion implantation is carried out at a temperature in a range from the room temperature to 700° C.

The ion implantation of the lighter element is carried out in such a way that the implanted ion concentration profile has a desired depth in the gate region. It is preferable that the ion implantation is carried out a plurality of times in such a way that the implantation depth ($x_j$) is varied each time. Of the plural ion implantations, one ion implantation, for instance, with a shallow implantation depth, is preferably carried out in such a way that the position of the peak of the concentration profile in the $x_j$ direction substantially coincides with the peak position of the concentration profile of the dopant doped in the impurity doping process. It is further preferable that the ion implantation concentration is substantially the same in each repetition of ion implantation. The implantation depth is controlled by controlling the acceleration energy of ions to be implanted and/or changing the kind of ions to be implanted.

Figure 6A:
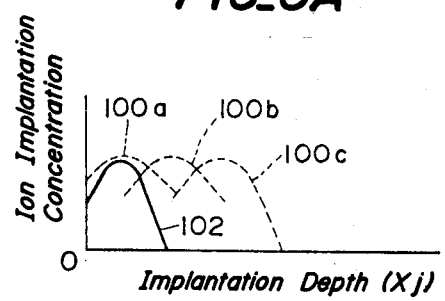
FIGS. 6A and 6B illustrate profiles of concentration of implanted ions and are used to explain the step of forming a deep impurity region in accordance with the present invention.

For example, the ion implantation of $H^+$ is carried out by changing the implantation depth three times, as shown in the implantation concentration profile in FIG. 6A. The implantation depths in the three steps are as indicate by the dotted-line curves 100a, 100b and 100c. The three steps of the ion implantation with different implantation depths can be carried out in any order. Further, it is preferable that the peaks of the concentration profile are substantially the same. The peak in the direction $x_j$ of the shallow ion implantation profile as indicated by the broken-line curve 100a is substantially coincident with the concentration peak in the direction $x_j$ of the profile 102 of the impurity ions (for instance, B) implanted in the previous step.

While in FIG. 5B, the light element ions implanted by the light element ion flow 30 are schematically indicated by X's 32, the implanted ions have a profile as shown in FIG. 6A in practice.

Figure 5C:
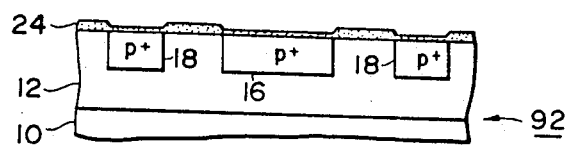
Figure 6B:
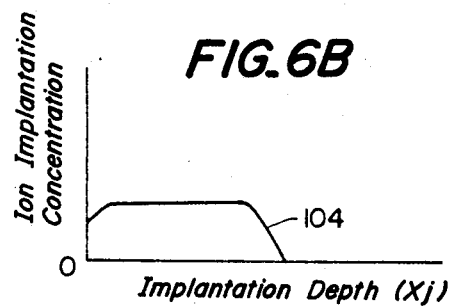

Next, the whole structure 92 is annealed at a low temperature, so that the thermal diffusion of the dopant in the direction $x_j$ results in a profile curve 104 as shown in FIG. 6B. This condition is schematically shown in FIG. 5C. In the case of a split gate type static induction transistor (see FIG. 2), the $p^+$ regions thus formed become the control gate 16 and the shielding gate 18. The same is also applicable to a non-split gate type static induction transistor (see FIG. 1). That is, the $p^+$ regions thus formed become the gates 20.

The annealing temperature is relatively low and is between 500° and 1,200° C. It is preferable that the annealing temperature is between 700° and 900° C. It is preferable that the annealing temperature is low, because at a high annealing temperature the reallocation of lattice defects occurs. The annealing time is from 30 minutes to one hour. When the distance between the gate regions is of the order from 3 to 10μm, the depth of the $p^+$ regions thus formed is of the order from 0.5 to 5.0 μm. It is preferable that the depth is from 1 to 3 μm and it is most preferable that the depth is about 2.5 μm.

When the light element ions are implanted into the $n^-$ layer 12, many defects or vacancies are created in the crystal lattices in the $n^-$ layer 12. When the structure 92 is annealed at a low temperature as described above, these lattice defects are transferred by thermal diffusion. In this case, the lattice defects are transferred together with the impurity elements such as B which were doped in the previous process step. The implanted ions of the light element such as H or He are dissipated into the surrounding atmosphere from the surface of the structure 92 at such a temperature. As a result, the impurity elements are diffused anisotropically in the direction in which the lattice defects are distributed, so that a deep p+ region is formed in the direction of depth ($x_j$). For instance, in the case of an epitaxial layer with (111) surface, many impurity element ions diffuse in the direction <111> and few impurity element ions diffuse in the direction <110>.

In other words, in accordance with the anisotropic diffusion in the present invention, the ion implantation of ions of an element lighter in weight, than an element of dopant impurity is carried out a plurality of times so that the impurity dopant is implanted at a depth substantially corresponding to a desired impurity doping depth. Thereafter, the annealing is carried out so that the impurity element ions doped at a shallow depth are diffused only in the direction of depth by thermal diffusion. As a consequence, the impurity elements, which cannot be implanted at a greater depth by conventional ion implantation or thermal diffusion process, can be anisotropically diffused or distributed in the depth direction at a desired greater depth.

So far an explanation has been given of an example in which the impurity element is first implanted and then the light element is implanted, but it is to be understood that these steps can be reversed. That is, the light element can be implanted first and then the impurity element can be implanted. Alternatively, the impurity ions can be implanted between the plural implantations of the light element ions or the impurity ions and the light element ions can be implanted simultaneously. While the $SiO_2$ film is used as a mask in the case of ion implantation of the light element ions, it is to be understood that other silicon compounds such as $Si_3N_4$ may be used. Furthermore, a negative or positive photoresist such as polyimide can be used. An example of the ion implantation of light element ions follows.

EXAMPLE

Figure 7:
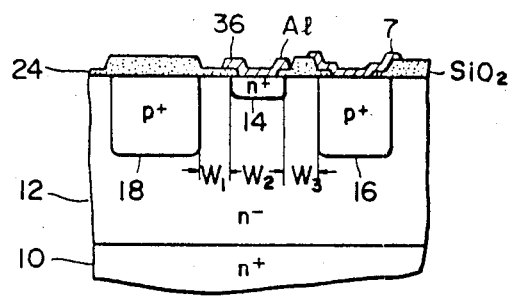
FIG. 7 is a cross sectional view showing an example of a deep impurity region fabricated in accordance with the present invention.

As shown in FIG. 7, the distance between the control gate 16 and the shielding gate 18 ($W_1+W_2+W_3$) was 4 μm and the width $W_1=1$ μm, $W_2=2$ μm and $W_3=1$ μm in one picture cell. B++ was implanted at the rate of $5\times10^{13}$ cm$^{-2}$ at the acceleration voltage of 200 kV. Thereafter, H+ ions were implanted three times at the rate of $1\times10^{15}$ cm$^{-2}$ at the acceleration voltage of 40 kV, 100 kV and 200 kV, sequentially. Next, the picture cell was annealed for about one hour at about 700° C. As a result, the p+ regions 16 and 18 with a B acceptor concentration of $10^{17}$ cm$^{-3}$ were formed in the depth direction at the depth of about 2.5 μm.

Figure 5D:
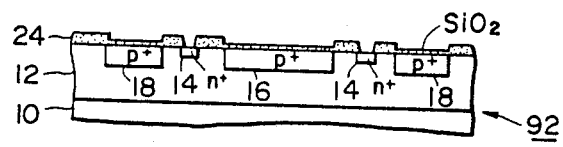
Figure 5E:
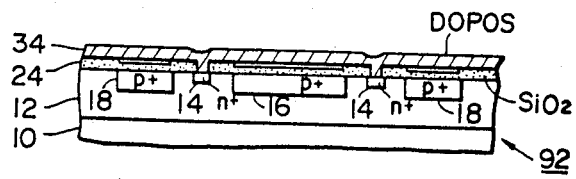

The structure 92 which has been annealed at a low temperature is transferred to the step for forming a drain region 14 (FIG. 5D). An opening or window is formed in the $SiO_2$ film 24 corresponding to the drain region 14 by wet etching process. As, for example, is diffused to the n− layer 12 through the window, so that the n+ region 14 as the drain region is formed in the n− layer 12.

Further, the dimensions shown in FIGS. 5D through 5M are different in the longitudinal or depth direction from those as shown in FIGS. 5A through 5C for clarity.

Figure 5F:
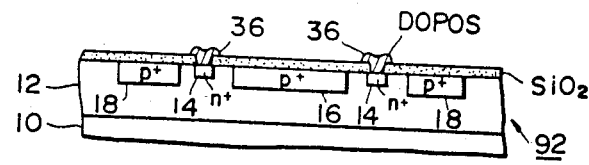
Figure 5G:
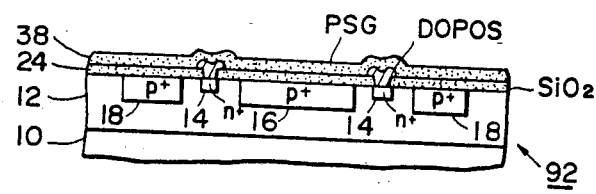

Next, a DOPOS (doped polycrystalline silicon) layer 34 is formed on the whole surface of the structure 92 by CVD (chemical vapor deposition) method (FIG. 5E) of the DOPOS layer 34, the portion other than the portion corresponding to the drain regions 14 is selectively removed by plasma etching process, so that drain electrodes 36 are formed (FIG. 5F).

Figure 5H:
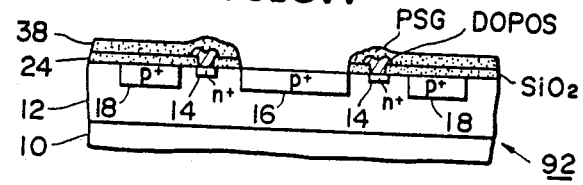

Subsequently, a PSG (phosphorus silicate glass) layer 38 is formed on the surface of the structure 92 by CVD method (FIG. 5G) and then the portion of the PSG layer 38 and the $SiO_2$ film 24 corresponding to the control gate region 16 are selectively removed by wet etching process, so that an inter-layer insulating layer 38 is formed (FIG. 5H).

Figure 5I:
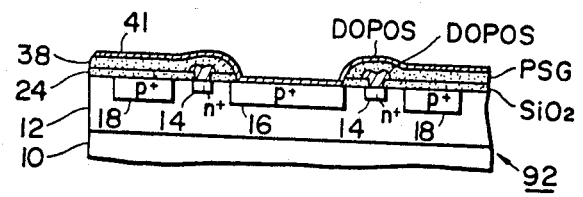
Figure 5J:
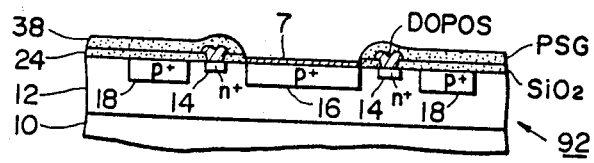

Thereafter, a DOPOS layer 41 is deposited over the surface of the structure 92 by CVD method (FIG. 5I). Except the portion of the DOPOS layer 41 corresponding to the control gate region 16, the DOPOS layer 41 is selectively removed by plasma etching, so that the control gate electrode 7 is formed (FIG. 5J).

Figure 5K:
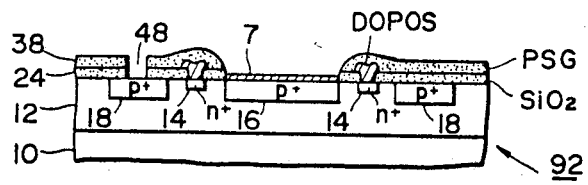

An opening or window 48 for the shielding gate region 18 is formed through the PSG layer 38 and the $SiO_2$ layer 24 by selectively removing these layers by plasma etching process (FIG. 5K).

Figure 5L:
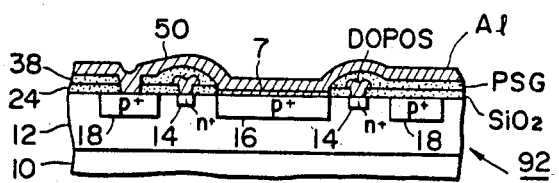
Figure 5M:
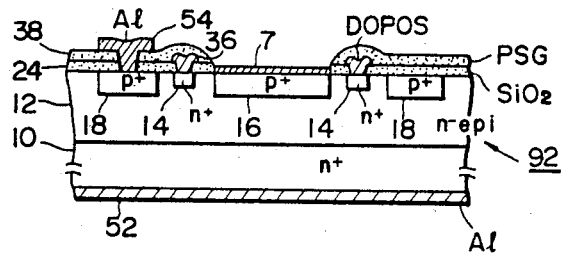

Next, an aluminum (Al) layer 50 is deposited on the surface of the structure 92 by electron beam sputtering and resistance heating process (FIG. 5L). Except the portion of the aluminum layer 50 which corresponds to the shielding gate region 18, the aluminum layer 50 is selectively removed by etching process, so that the shielding gate electrode 54 is formed (FIG. 5M). An aluminum film 52 is deposited over the other major surface of the substrate 10, so that a source electrode (S) is formed. In this manner, the split gate type static induction transistor (for example, of the type as shown in FIG. 2) is fabricated. In the case of the fabrication of the non-split gate type static induction transistor of the type as shown in FIG. 1, the same process steps may be employed, except the formation of the single gate region 20 instead of the control gate region 16 and the shielding gate region 18.

A plurality of static induction transistors of the type as shown in FIG. 5M may be two-dimensionally arranged to form a mosaic or XY array on a single chip. In this case, the gate electrode 7 and the drain electrode 36 are isolated from each other by the insulating layer 38, so that the XY array may provide a switching matrix in which an X and Y addresses can be selected by the electrodes 7 and 36.

Figure 8F:
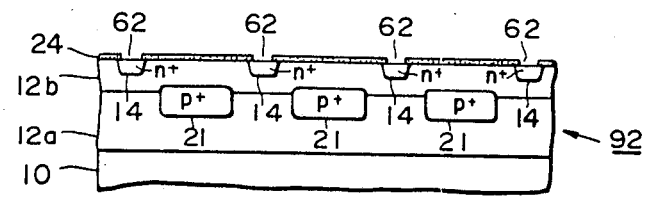
Figure 8G:
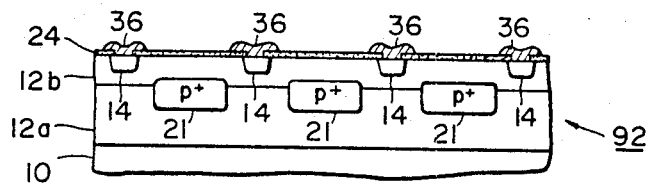

Referring next to FIGS. 8A through 8H, the process for fabricating a buried gate type static induction transistor in accordance with the present invention will be described. The process steps as shown in FIGS. 8A, 8B and 8C are substantially the same as those as shown in FIGS. 5A, 5B and 5C, except that the region 21 formed by diffusing impurity element ions is used as a buried gate region instead of the control gate region 16 and the shielding gate region 18, as shown in FIG. 5C, and except that instead of the $SiO_2$ film 24 as shown in FIGS. 5A through 5C which is left in the completed or fabricated device, the $SiO_2$ film 25 which is to be removed later is used in the steps shown in FIGS. 8A through 8C.

After the $SiO_2$ film 25 is removed, the n− layer 12b which is similar to the n− epitaxial layer 12a is epitaxially grown and then is subjected to heating (FIG. 8D). In this case, conventional process steps are added in order to form the gate electrode 60 (FIG. 4).

The $SiO_2$ film 24 is applied to the surface of the n− layer 12b and portions 62 which are located between the gate regions 21 are removed by etching (FIG. 8E). Thereafter, the SiO$_2$ film 24 is used as a mask and an acceptor impurity such as As is doped through the openings 62 of the mask layer 24 into the n$^-$ layer 12b and then heated, so that the drain regions 14 are formed (FIG. 8F).

Figure 8H:
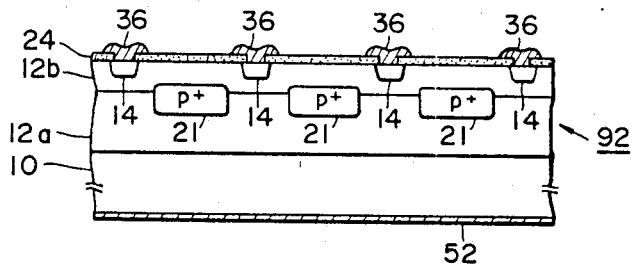

Subsequently, the drain electrodes 36 are formed through the openings or windows 62 (FIG. 8G) and a source electrode 52 is formed by depositing aluminum over the other major surface of the substrate 10. In this manner, the buried gate type static induction transistors are provided in the form of an integrated circuit (FIG. 8H).

Next, the process for fabricating a solid-state image sensor device having longitudinal static induction transistors in accordance with the present invention will be described in detail.

Figure 9:
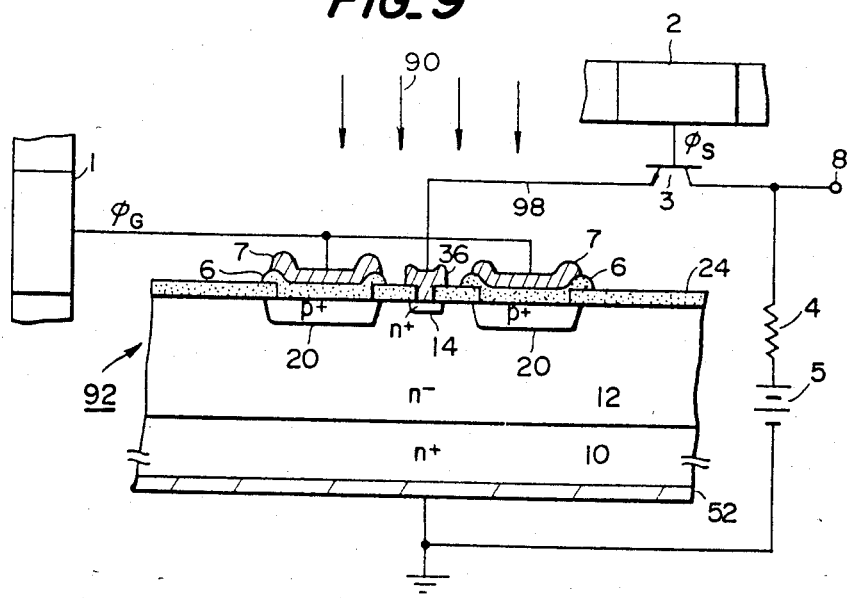
FIG. 9 is a schematic cross sectional view showing an example of a part of an example of a solid-state image sensor device having a plurality of static induction transistors.

FIG. 9 shows one example of a picture cell of a solid-state image sensor device having longitudinal static induction transistors. Each picture cell has a non-split gate type static induction transistor in which the gate region is not divided into the control gate (CG) and the shielding gate (SG). A plurality of such picture cells are arrayed one-or two-dimensionally to form a linear or area image sensor device.

Fundamentally, such a picture cell having a static induction transistor is fabricated as follows. Firstly, an n$^-$ ($\nu$) or intrinsic (i) layer 12 is epitaxially grown on one major surface of an n$^+$ silicon substrate 10 and then an n$^+$ region 14 and a p$^+$ region 20 are formed in the vicinity of the surface of the epitaxial layer 12. The region 14 is a drain region, while the region 20 is a gate region. A source electrode 52 is formed on the other major surface of the substrate 10.

Referring still to FIG. 9, the silicon oxide SiO$_2$ film 24 is formed on the surface of the epitaxial layer 12. The drain electrode 36 is so formed on the SiO$_2$ film 24 that the drain electrode 36 is in electrical contact with the drain region 14 through an opening or window formed in the SiO$_2$ film 24, while an insulating layer 6 such as SiO$_2$, SiN or Ta$_2$O$_5$ is formed so as to be in electrical contact with the gate region 20 through an opening or window, and then the gate electrode 7 is formed on the insulating layer 6. It is preferable that the gate electrode 7 is made of a transparent electrode material such as SnO$_2$, In$_2$O$_3$, polycrystalline silicon or silicide.

The gate electrode 7 is connected to a readout address circuit 1, so that a readout gate pulse $\phi_G$ is applied to the gate electrode 7 from the circuit 1. The drain electrode 36 is connected through a switching transistor 3 to an output terminal 8 which is connected to a video voltage power supply 5 through a load resistor 4. The gate of the switching transistor 3 is connected to a selection circuit 2 which supplies a video line selection pulse $\phi_s$ to the gate. In the embodiment as shown in FIG. 9, the n$^+$ region 14 is the drain, while the n$^+$ substrate 10 is the source, but it is to be understood that the n$^+$ region 14 may be the source, while the n$^+$ substrate 10 may be the drain. In the latter case, it is preferable that the polarity of the power supply 5 is reversed and the switching transistor is connected to the n$^+$ substrate 10.

Figure 10:
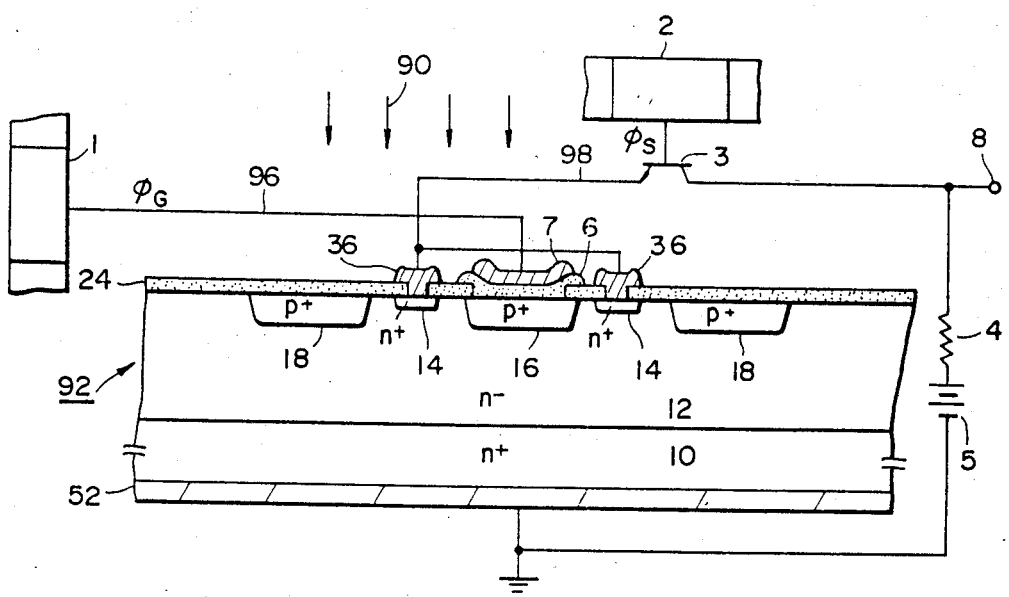

FIG. 10 shows a picture cell formed by a so-called split gate type static induction transistor in which a control gate and a shielding gate are separated from each other. Instead of the gate region 20 as shown in FIG. 9, two gate regions 16 and 18 are provided. The gate region 16 is the control gate which controls the storage of light-excited carriers and the readout, while the region 18 is the shielding gate which isolates this individual static induction transistor from other or adjacent static induction transistors and provides a reference potential. A plurality of picture cells as shown in FIG. 10 are arranged one- or two-dimensionally to form a linear or area image sensor device. In the split gate type static induction transistor, it is to be understood that the source and the drain can be replaced by each other.

FIG. 11 shows a modification of the picture cell having the split gate type static induction transistor of the type shown in FIG. 10. The drain (source) region 14 is formed in the vicinity of the shielding gate 18, so that the expansion of the depletion layer of the control gate region 16 is increased to store many light carriers. The depth of the shielding gate region 18 is deeper than that of the control gate region 16, so that the element isolation effect is improved.

The surface of the picture cells is coated with a light shielding layer 56 of, for instance, aluminum, except the surface portions corresponding to the control gate region 16 and the drain (source) region 14.

FIG. 12 is a top plan view showing the solid-state area image sensor device having the split gate type static induction transistors of the type as shown in FIG. 10. The solid-state area image sensor device has a plurality of static induction transistors as picture cells 94 which are arranged two-dimensionally. The control gate electrodes 7 of the respective picture cells 94 are connected in common by transparent electrode stripes 96 which extend in the Y direction, while the drain (source) electrodes 36 are connected in common by drain electrode stripes 98 which extend in the X direction. Further, isolation layers or the like are not shown for clarity.

Figure 13:
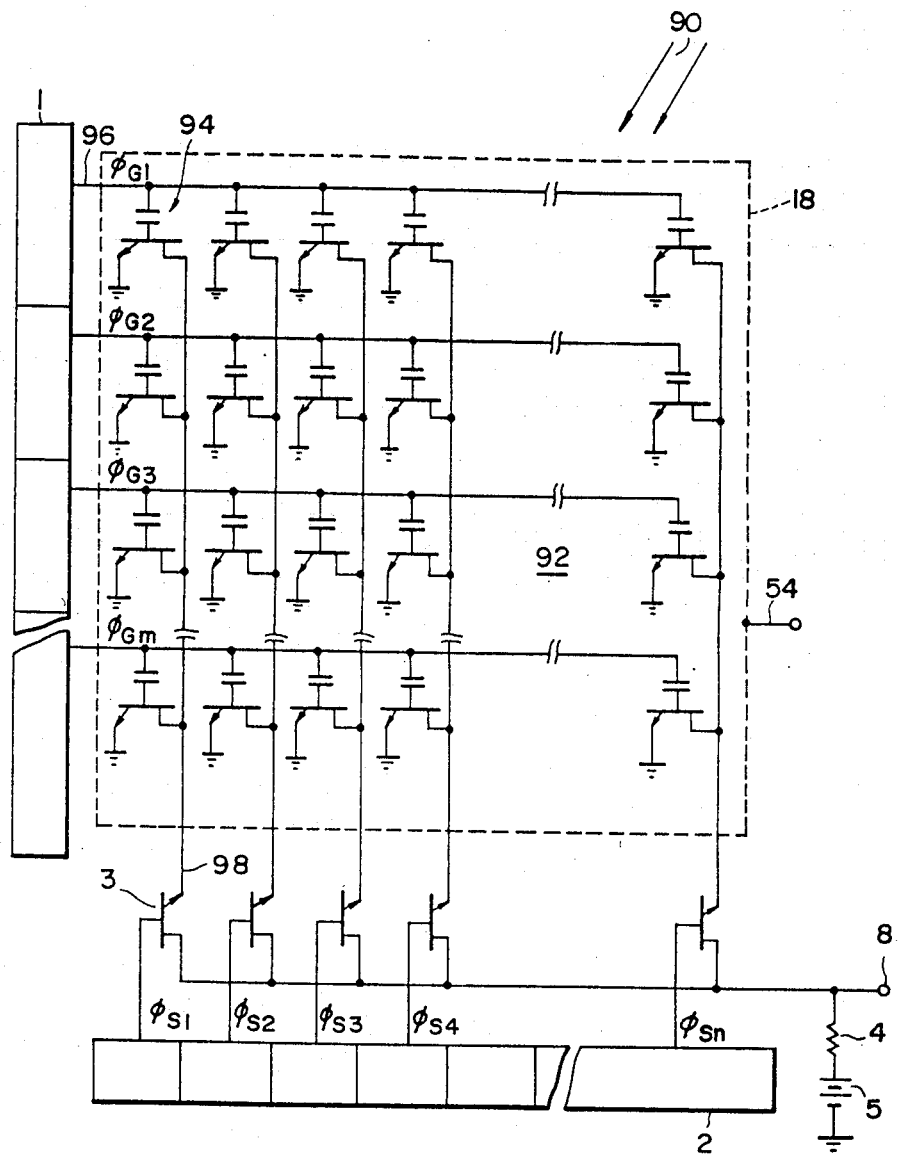
FIG. 13 is a circuit diagram showing a circuit arrangement of a solid-state image sensor device having a plurality of static induction transistors.

FIG. 13 shows a circuit arrangement of the solid-state image sensor device. The picture cells or static induction transistors 94 are two-dimensionally arranged to form a matrix or array. The lead wires 96 extending from the readout address circuit 1 supply the readout gate pulses $\phi_{G1}$–$\phi_{Gm}$. The lead wires 98 are connected to the switching transistors 3, respectively. The video line selection circuit 2 applies the video line selection pulses $\phi_{s1}$–$\phi_{sn}$ to the switching transistors 3. The shielding gate 18 is schematically indicated by the broken lines and is connected to a lead wire 54 so that a reference potential is applied to the shielding gate 18.

Figure 14F:
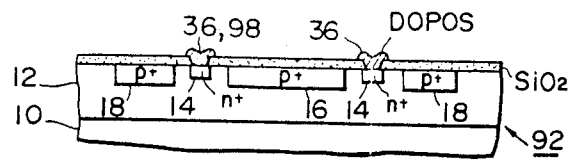
FIGS. 14A through 14O are explanatory cross sectional views showing an example of the sequential process steps for fabrication of a solid-state image sensor device having a plurality of static induction transistors in accordance with the present invention.
Figure 14G:
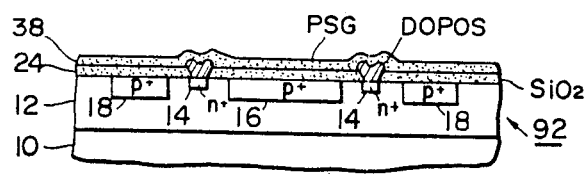
Figure 14H:
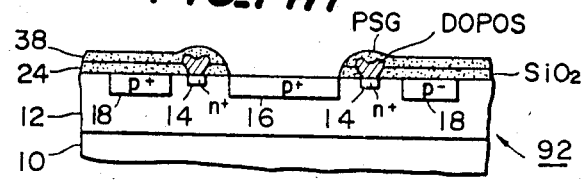
Figure 14I:
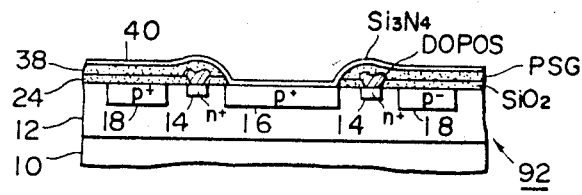
Figure 14J:
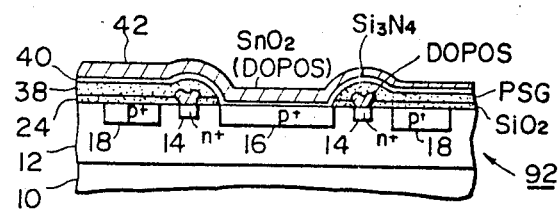
Figure 14K:
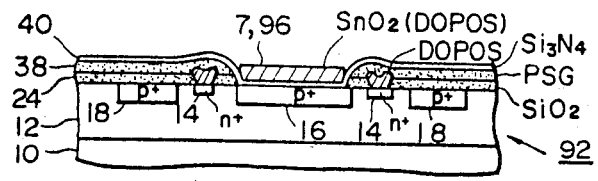
Figure 14L:
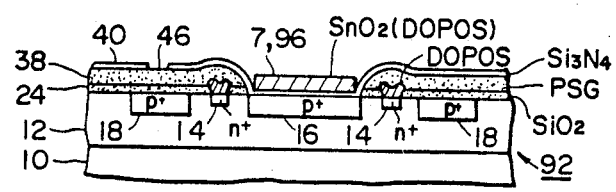
Figure 14M:
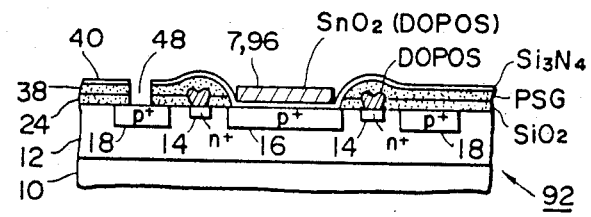
Figure 14N:
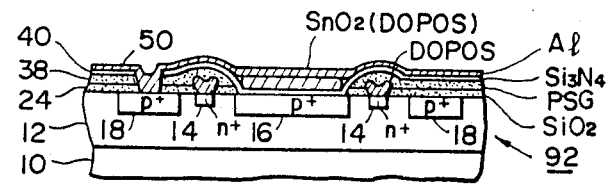
Figure 14O:
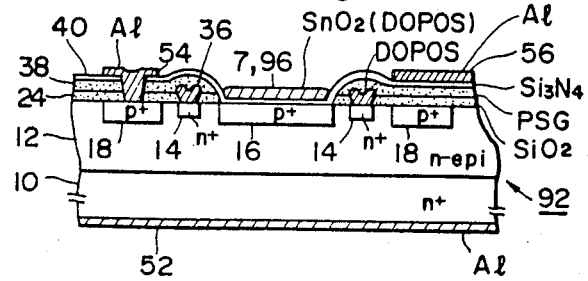

Referring next to FIGS. 14A through 14O, the process for fabricating a solid-state image sensor device having static induction transistors in accordance with the present invention will be described. Further, FIGS. 14A through 14O show in section only a portion of the device including a static induction transistor 94 corresponding to one picture cell and are exaggerated in dimension for clear understanding of the process steps.

First, the n$^+$ silicon substrate 10 is heavily doped with Sb the order of $10^{18}$ cm$^{-3}$. The n$^-$ layer 12 is epitaxially grown on one major surface of the substrate 10 and the SiO$_2$ film 24 is formed on the epitaxially grown layer 12. The layer 12 is doped with As in the order of $10^{12}$–$10^{15}$ cm$^{-3}$ and has a thickness of 5–10 μm.

Portions 26 of the SiO$_2$ film 24 which correspond to the gate regions 16 and 18 or 21 are partially removed by a wet etching process. The distance between the gate regions 16 and 18 or between the gate regions 21 is 3–10 μm.

Next, the impurity as the acceptor, for example, the III group element such as B, Al or Ga, is doped into the portions of the n⁻ layer 12, which correspond to the gate regions 16 and 18 or 21 through the thin portions 26 of the SiO₂ film 24 (FIG. 14A), so that the p⁺ regions 28 are formed as shown in FIG. 14A. It is advantageous to employ the ion implantation or thermal diffusion process in order to dope the impurities into the layer 12. For instance, in the case of the ion implantation of B⁺ or B⁺⁺ ions, an acceleration energy is in the order of 10–400 kV and the dosage in dopant is of the order of $10^{12}$–$10^{15}$ cm⁻². In order to locate the implanted impurity atoms stably at the crystal lattice positions after the ion implantation, an activation annealing may be effected at a low temperature for instance, about 700° C.

Thereafter, the ions of an element lighter than the doped impurity such as B are implanted into the portions corresponding to the gate regions 16 and 18 or 21 (FIG. 14B). The lighter element may be for instance H or He. In the case of the ion implantation of H⁺, the acceleration energy is 10–200 kV and the dosage of the dopant is in the order of $10^{14}$–$10^{17}$ cm⁻². It is preferable that the ion implantation is carried out at a temperature in a range from the room temperature to 700° C.

The ion implantation of the lighter element is carried out in such a way that the implanted ion concentration profile has a desired depth in the gate region. It is preferable that the ion implantation is carried out a plurality of times in such a way that the implantation depth ($x_j$) is varied each time. Of the plural ion implantations, one ion implantation, for instance, with a shallow implantation depth, is preferably carried out in such a way that the position of the peak of the concentration profile in the $x_j$ direction substantially coincides with the peak position of the concentration profile of the dopant doped in the impurity doping process. It is further preferable that the ion implantation concentration is substantially the same in each repetition of ion implantation. The implantation depth is controlled by controlling the acceleration energy of ions to be implanted and/or changing the kind of ions to be implanted.

For example, the ion implantation of H⁺ is carried out by changing the implantation depth three times, as shown in the implantation concentration profile in FIG. 6A. The implantation depths in the three steps are as indicate by the dotted-line curves 100a, 100b and 100c.

The three steps of the ion implantation with different implantation depths can be carried out in any order. Further, it is preferable that the peaks of the concentration profile are substantially the same. The peak in the direction $x_j$ of the shallow ion implantation profile as indicated by the broken-line curve 100a is substantially coincident with the concentration peak in the direction $x_j$ of the profile 102 of the impurity ions (for instance, B) implanted in the previous step.

While in FIG. 14B, the light element ions implanted by the light element ion flow 30 are schematically indicated by X's 32, the implanted ions have a profile as shown in FIG. 6A in practice.

Next, the whole structure 92 is annealed at a low temperature, so that the thermal diffusion of the dopant in the direction $x_j$ results in a profile curve 104 as shown in FIG. 6B. This condition is schematically shown in FIG. 14C. In the case of a split gate type static induction transistor (see FIG. 10), the p⁺ regions thus formed become the control gate 16 and the shielding gate 18. The same is also applicable to a non-split gate type static induction transistor (see FIG. 9). That is, the p⁺ regions thus formed become the gates 20.

The annealing temperature is relatively low and is between 500° and 1,200° C. It is preferable that the annealing temperature is between 700° and 900° C. It is preferable that the annealing temperature is low, because at a high annealing temperature the reallocation of lattice defects occurs. The annealing time is from 30 minutes to one hour. When the distance between the gate regions is of the order from 3 to 10 μm, the depth of the p⁺ regions thus formed is of the order from 0.5 to 5.0 μm. It is preferable that the depth is from 1 to 3 μm and it is most preferable that the depth is about 2.5 μm.

When the light element ions are implanted into the n⁻ layer 12, many defects or vacancies are created in the crystal lattices in the n⁻ layer 12. When the structure 92 is annealed at a low temperature as described above, these lattice defects are transferred by thermal diffusion. In this case, the lattice defects are transferred together with the impurity elements such as B which were doped in the previous process step. The implanted ions of the light element such as H or He are dissipated into the surrounding atmosphere from the surface of the structure 92 at such a temperature. As a result, the impurity elements are diffused anisotropically in the direction in which the lattice defects are distributed, so that a deep p⁺ region is formed in the direction of depth ($x_j$). For instance, in the case of an epitaxial layer with (111) surface, many impurity element ions diffuse in the direction $<111>$ and few impurity element ions diffuse in the direction $<110>$.

In other words, in accordance with the anisotropic diffusion in the present invention, the ion implantation of ions of an element lighter in weight than an element of dopant impurity is carried out a plurality of times so that the impurity dopant is implanted at a depth substantially corresponding to a desired impurity doping depth. Thereafter, the annealing is carried out so that the impurity element ions doped at a shallow depth are diffused only in the direction of depth by thermal diffusion. As a consequence, the impurity elements, which cannot be implanted at a greater depth by conventional ion implantation or thermal diffusion process, can be anisotropically diffused or distributed in the depth direction at a desired greater depth.

So far an explanation has been given of an example in which the impurity element is first implanted and then the light element is implanted, but it is to be understood that these steps can be reversed. That is, the light element can be implanted first and then the impurity element can be implanted. Alternatively, the impurity ions can be implanted between the plural implantations of the light element ions or the impurity ions and the light element ions can be implanted simultaneously. While the SiO₂ film is used as a mask in the case of the ion implantation of the light element ions, it is to be understood that other silicon compounds such as Si₃N₄ may be used. Furthermore, a negative or positive photoresist such as polyimide can be used. An example of the ion implantation of light element ions follows.

EXAMPLE

Figure 15:
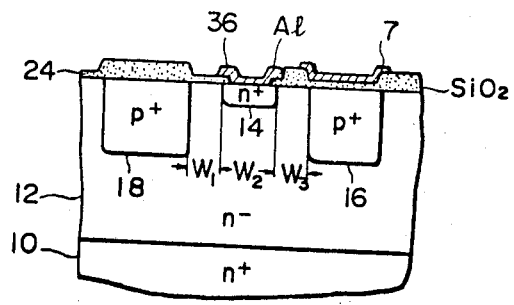
FIG. 15 is a cross sectional view showing an example of a deep impurity region formed in accordance with the present invention.

As shown in FIG. 15, the distance between the control gate 16 and the shielding gate 18 ($W_1+W_2+W_3$) was 4 μm and the width $W_1=1$ μm, $W_2=2$ μm and $W_3=1$ μm in one picture cell. B⁺⁺ was implanted at the rate of $5\times10^{13}$ cm⁻² at the acceleration voltage of 200 kV. Thereafter, H⁺ ions were implanted three times at the rate of $1\times10^{15}$ cm⁻² at the acceleration voltage of 40 kV, 100 kV and 200 kV, sequentially.

Next, the picture cell was annealed for about one hour at about 700° C. As a result, the p+ regions 16 and 18 with a B acceptor concentration of $10^{17}$ cm$^{-3}$ were formed in the depth direction at the depth of about 2.5 μm.

The structure 92 which has been annealed at a low temperature is transferred to the step for forming a drain region 14 (FIG. 14D). An opening or window is formed in the SiO$_2$ film 24 corresponding to the drain region 14 by wet etching process. As, for example, is diffused to the n$^-$ layer 12 through the window, so that the n$^+$ region 14 as the drain region is formed in the n$^-$ layer 12.

Further, the dimensions shown in FIGS. 14D through 14M are different in the longitudinal or depth direction from those as shown in FIGS. 14A through 14C for clarity.

Next, a DOPOS (doped polycrystalline silicon) layer 34 is formed on the whole surface of the structure 92 by CVD (chemical vapor deposition) method (FIG. 14E) of the DOPOS layer 34, the portion other than the portion corresponding to the drain regions 14 is selectively removed by plasma etching process, so that drain electrodes 36 and the drain electrodes stripe 98 are formed (FIG. 14F).

Subsequently, a PSG (phosphorus silicate glass) layer 38 is formed on the surface of the structure 92 by CVD method (FIG. 14G) and then the portion of the PSG layer 38 and the SiO$_2$ film 24 corresponding to the control gate region 16 are selectively removed by wet etching process, so that an inter-layer insulating layer 38 is formed (FIG. 14H).

Thereafter, an Si$_3$N$_4$ layer 40 is deposited over the surface of the structure 92 by CVD method (FIG. 14I). Then, a layer 42 of transparent electrode material SnO$_2$ or DOPOS is formed on the Si$_3$N$_4$ layer 40 by CVD method. Except the portion of the SnO$_2$ or DOPOS layer 42 corresponding to the control gate region 16, the DOPOS layer 41 is selectively removed by plasma etching, so that the control gate electrode 7 and the gate electrode stripe 96 (see FIG. 12) are formed (FIG. 14K).

A portion 46 of the Si$_3$N$_4$ layer 40 which corresponds to the shielding gate region 18 is selectively removed by plasma etching process to form an opening or window (FIG. 14L). Then, a portion 48 of the underlying PSG layer 38 and SiO$_2$ layer 24 is selectively removed by wet etching process to form an opening or window (FIG. 14M).

Next, an aluminum (Al) layer 50 is deposited on the surface of the structure 92 by electron beam sputtering and resistance heating process (FIG. 14N). Except the portion of the aluminum layer 50 which corresponds to the shielding gate region 18, the aluminum layer 50 is selectively removed by etching process, so that the light shielding layer 56 (see FIG. 11) and the shielding gate electrode 54 are formed (FIG. 14O). An aluminum film 52 is deposited over the other major surface of the substrate 10, so that a source electrode (S) is formed. In this manner, the solid-state image sensor device having the split gate type static induction transistors (for example, of the type as shown in FIG. 10) is fabricated. In the case of the fabrication of the image sensor device having the non-split gate type static induction transistors of the type as shown in FIG. 9, the same process steps may be employed, except the formation of the single gate region 20 instead of the control gate region 16 and the shielding gate region 18.

According to the present invention, ions of an element lighter than an impurity element to be doped are implanted a plurality of times with different implantation depths and then the annealing process is carried out so that the impurity can be anisotropically thermally diffused in the depth direction. As a result, there is fabricated a longitudinal static induction transistor in which the gate region is formed deeply with a desired depth in the longitudinal direction; that is, the thickness direction of the structure. When the static induction transistor is designed, it is not necessary to determine the distance between the gates by previously anticipating the lateral thermal diffusion. Thus, the static induction transistors can be fabricated uniformly.

Therefore, there is fabricated a solid-state image sensor device having longitudinal static induction transistors which has a uniform light reception region in each of a plurality of picture cells.

Therefore, the present invention can be advantageously applied to the formation of a region such as a shielding gate region which must be formed deeply with a desired depth. Since the shielding gate region can be formed deeply, there is fabricated a solid-state image sensor device in which picture cells are definitely isolated from each other. It follows, therefore, that the present invention may be applied only to the formation of a control gate region which must be formed deeply.

In the case of a solid-state image sensor device having static induction transistors in which a portion of each control gate is formed shallow by so that a sensitivity to a short wavelength (blue region) light is improved, the present invention can be applied only to the steps of the formation of the deep portion of each control gate.

FIG. 16 shows an example of a static induction transistor in a image sensor device in accordance with the present invention. In this example, the deep portion 16a of the control gate region 16 is formed by the process in accordance with the present invention, while the shallow portion 16b may be formed by conventional process.

While the invention has been described in connection with what is presently considered to be the most practical and preferred embodiments, it is understood that the invention is not to be limited to the disclosed embodiment but, on the contrary, is intended to cover various modifications and equivalent arrangements included within the spirit and scope of the appended claims which scope is to be accorded the broadest interpretation so as to encompass all such modifications and equivalent structures.

What is claimed is:

1. A process for fabricating a static induction transistor having a gate region which is formed in a semiconductor layer including a channel region, said process comprising:

a first step of implanting ions of an impurity element into said semiconductor layer from the surface thereof to form said gate region;

a second step of implanting ions of at least one of H and He into said gate region from the surface of said semiconductor layer in such a way that the concentration of said at least one of H and He exhibits a plurality of profiles in a depth direction of said semiconductor layer; and a third step of annealing said semiconductor layer at a relatively low temperature after said first and second steps to form said gate region in said semiconductor layer.

2. A process for fabricating a static induction transistor as claimed in claim 1, wherein said first step precedes said second step.

3. A process for fabricating a static induction transistor as claimed in claim 1, wherein said second step precedes said first step.

4. A process for fabricating a static induction transistor as claimed in claim 1, wherein said first step includes a sub-step of heating said semiconductor layer at a relatively low temperature after the implantation of the ions of said impurity element.

5. A process for fabricating a static induction transistor as claimed in claim 1, wherein said semiconductor layer comprises an epitaxially grown layer which is formed on a semiconductor substrate and which has a relatively low impurity concentration, and said impurity element includes at least one element selected from the group consisting of B, Al and Ga.

6. A process for fabricating a static induction transistor as claimed in claim 1, wherein said static induction transistor is a surface gate type static induction transistor.

7. A process for fabricating a static induction transistor as claimed in claim 1, wherein said static induction transistor is a buried gate type static induction transistor.

8. A process for fabricating a static induction transistor as claimed in claim 5, wherein said relatively low temperature is in the range from 500° C. to 1200° C.

9. A process for fabricating a static induction transistor as claimed in claim 5, wherein said relatively low temperature is in the range from 700° C. to 900° C.

10. A process for fabricating a static induction transistor as claimed in claim 1, wherein said plurality of profiles consists of three concentration profiles.

11. A process for fabricating a solid-state image sensor device picture cell having picture cells, each having a static induction transitor having a gate region which is formed in a semiconductor layer including a channel region and to which a light signal is incident, said process comprising:

a first step of implanting ions of impurity element into said semiconductor layer from the surface thereof to form said gate region;

a second step of implanting ions of an element lighter than said impurity element into said gate region from the surface of said semiconductor layer in such a way that the concentration of said light element exhibits a plurality of profiles in the depth direction of said semiconductor layer; and a third step of annealing said semiconductor layer at a relatively low temperature after said first and second steps to form said gate region in said semiconductor layer.

12. A process for fabricating a solid-state image sensor device as claimed in claim 11, wherein said first step precedes said second step.

13. A process for fabricating a solid-state image sensor device as claimed in claim 11, wherein said second step precedes said first step.

14. A process for fabricating a solid-state image sensor device as claimed in claim 11, wherein said first step includes a sub-step of heating said semiconductor layer at a relatively low temperature after the implantation of the ions of said impurity element.

15. A process for fabricating a solid-state image sensor device as claimed in claim 11, wherein said semiconductor layer comprises an epitaxially grown layer which is formed on a semiconductor substrate and which has a relatively low impurity concentration, and said impurity element includes at least one element selected from the group consisting of B, Al and Ga.

16. A process for fabricating a solid-state image sensor device as claimed in claim 15, wherein said element lighter than said impurity element includes at least one of H and He.

17. A process for fabricating a solid-state image sensor device as claimed in claim 15, wherein said relatively low temperature is in the range from 500° C. to 1200° C.

18. A process for fabricating a solid-state image sensor device as claimed in claim 15, wherein said relatively low temperature is in the range from 700° C. to 900° C.

19. A process for fabricating a solid-state image sensor device as claimed in claim 16, wherein said plurality of profiles consists of three concentration profiles.

* * * * *